US008681133B2

(12) United States Patent
Bae et al.

(10) Patent No.: US 8,681,133 B2

(45) Date of Patent: Mar. 25, 2014

(54) DISPLAY DRIVER INTEGRATED CIRCUIT WHICH STORES OUTPUT MODE OF DRIVING CIRCUIT CONTROL SIGNAL IN NON-VOLATILE MEMORY AND METHOD OF OUTPUTTING THE DRIVING CIRCUIT CONTROL SIGNAL

(75) Inventors: Jong-kon Bae, Seoul (KR); Seong-cheol Kim, Seoul (KR); Won-sik Kang, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1477 days.

(21) Appl. No.: 11/733,496

(22) Filed: Apr. 10, 2007

(65) Prior Publication Data

US 2007/0252828 A1 Nov. 1, 2007

(30) Foreign Application Priority Data

Apr. 28, 2006 (KR) ........................ 10-2006-0038868

(51) Int. Cl.

| | |
|---|---|
| ***G06F 3/038*** | (2013.01) |
| ***G09G 5/00*** | (2006.01) |
| ***H01L 23/48*** | (2006.01) |
| ***H01L 23/52*** | (2006.01) |
| ***H01L 21/00*** | (2006.01) |

(52) U.S. Cl.

USPC ............ 345/204; 345/690; 257/692; 438/113

(58) Field of Classification Search

USPC .................................. 345/204, 690; 438/113

See application file for complete search history.

(56) References Cited

U.S. PATENT DOCUMENTS

| | | | | |
|---|---|---|---|---|
| 7,298,040 | B2 * | 11/2007 | Cornelius | 257/692 |
| 2004/0051707 | A1 * | 3/2004 | Yamazaki et al. | 345/204 |
| 2004/0161878 | A1 * | 8/2004 | Or-Bach et al. | 438/113 |
| 2007/0013725 | A1 * | 1/2007 | Burkhardt et al. | 345/690 |

FOREIGN PATENT DOCUMENTS

| | | |
|---|---|---|
| JP | 11-045233 | 2/1999 |
| KR | 1999-0043662 | 6/1999 |
| KR | 1020030068824 A | 8/2003 |
| KR | 1020050046520 A | 5/2005 |

* cited by examiner

*Primary Examiner* — Charles V Hicks

(74) *Attorney, Agent, or Firm* — F. Chau & Associates, LLC

(57) ABSTRACT

A display driver integrated circuit (IC) that stores an output mode of driving circuit control signal in a non-volatile memory and a method of outputting the driving circuit control signal, wherein the display drive IC fixes the driving circuit control signal values using fixation wire disposed on top layers of the display driver IC, and a method of manufacturing the display driver IC. The display driver IC includes a plurality of driving circuits, which operate a display panel; a driving circuit control signal output unit, which outputs a plurality of driving circuit control signal values, which control the driving circuits, received from an external device in a test mode, or outputs the plurality of driving circuit control signal values, which control the driving circuits that are internally set to a plurality of fixed values in a production mode; and a non-volatile memory, which stores a mode selection value indicating the test mode or the production mode, wherein the driving circuit control signal output unit operates in the test mode or the production mode in response to the mode selection value stored in the non-volatile memory. In the display drive IC, which stores an output mode of a driving circuit control signal in a non-volatile memory, and a method of outputting the driving circuit control signal, whether to fix a driving circuit control signal value or not can be changed after the display driver IC is assembled into a module.

35 Claims, 5 Drawing Sheets

DISPLAY DRIVER INTEGRATED CIRCUIT WHICH STORES OUTPUT MODE OF DRIVING CIRCUIT CONTROL SIGNAL IN NON-VOLATILE MEMORY AND METHOD OF OUTPUTTING THE DRIVING CIRCUIT CONTROL SIGNAL

CROSS-REFERENCE TO RELATED PATENT APPLICATION

This application claims the benefit of Korean Patent Application No. 10-2006-0038868, filed on Apr. 28, 2006, in the Korean Intellectual Property Office, the disclosure of which is incorporated herein in its entirety by reference.

BACKGROUND OF THE INVENTION

1. Technical Field

The present disclosure relates to a display driver integrated circuit (IC) and, more particularly, to a display driver IC that stores an output mode of a driving circuit control signal in a non-volatile memory and a method of outputting the driving circuit control signal, and a display drive IC that fixes the driving circuit control signal value using fixation wires disposed on top layers of the display driver IC and a method of manufacturing the display driver IC.

2. Discussion of Related Art

Conventionally, a display driver integrated circuit (IC) includes a plurality of driving circuits that operate a display panel. The display driver IC requires various control signals to control the driving circuits.

When the display driver IC is tested, the values of the control signals are modified and are input to the driving circuits. As such, a variety of tests are enabled for the display driver IC.

After the tests of the display driver IC are completed and before the display driver IC is assembled into a module, some of the values of the control signals are set to fixed values. The other values of the control signals are not set to fixed values such that the values of the control signals can be changed by a user.

Whether to fix the values of the control signals or not is determined, however, by a signal input through an input/output pin of the display driver IC. Accordingly, whether to fix the values of the control signals or not cannot be changed after the display driver IC is assembled.

Furthermore, when the values of the control signals are set to fixed values, all of a plurality of layers formed in the display driver IC have to be modified in order to change the fixed values of the control signals.

SUMMARY OF THE INVENTION

Exemplary embodiments of the present invention provide a display driver integrated circuit (IC) that stores an output mode of a driving circuit control signal in a non-volatile memory and a method of outputting the driving circuit control signal.

Exemplary embodiments of the present invention also provide a display driver IC that includes fixation wires disposed on top layers of the display driver IC and a method of manufacturing the display driver IC.

According to tan exemplary embodiments of the present invention, there is provided a display driver IC including a plurality of driving circuits, which operate a display panel; a driving circuit control signal output unit which outputs a plurality of driving circuit control signal values, which control the driving circuits, received from an external device in a test mode or outputs a plurality of driving circuit control signal values, which control the driving circuits, internally set to a plurality of fixed values in a production mode; and a non-volatile memory, which stores a mode selection value indicating the test mode or the production mode, wherein the driving circuit control signal output unit operates in the test mode or the production mode in response to the mode selection value stored in the non-volatile memory.

The driving circuit control signal output unit may include a plurality of registers, which receive a plurality of external setting values from an external device, store the external setting values, and output the stores external setting values as the driving circuit control signal values.

The driving circuit control signal output unit may include a plurality of multiplexers that selectively output the driving circuit control signal values output from the registers or output the driving circuit control signal values set to the fixed values in accordance with the mode selection value stored in the non-volatile memory.

The multiplexers may correspond to the registers.

The fixed values may be values of a source voltage or a ground voltage.

The mode selection value may be stored in the non-volatile memory after the display driver IC is assembled into a module.

The non-volatile memory may be a one-time programmable device (OTP), a multi-time programmable device (MTP), or a flash memory.

The non-volatile memory may sure only the mode selection value indicating the production mode.

The non-volatile memory may not store a mode selection value indicating the test mode.

The driving circuit control signal output unit operate in the production mode if the mode selection value is stored in the non-volatile memory, or operate in the test mode, if the mode selection value is not stored in the non-volatile memory.

According to an exemplary embodiments of the present invention, there is provided a display driver IC including a plurality of driving circuits, which operate a display panel; a driving circuit control signal output unit, which outputs a plurality of driving circuit control signal values, which control the driving circuits, received from an external device, or outputs a plurality of driving circuit control signal values, which control the driving circuits, internally set to a plurality of fixed values; and a plurality of fixation wires, which provide the driving circuit control signal values set to the fixed values to the driving circuit control signal output unit, wherein the fixation wires are disposed on top layers from among a plurality of layers formed in the display driver IC.

A plurality of internal wires of the driving circuit control signal output unit may extend to the top layers and be connected to the fixation wires, selectively.

The internal wires of the driving circuit signal output unit may be directly connected to the fixation wires, selectively, by a plurality of via elements.

The top layers may be two top layers from among the plurality of layers forming the display driver IC.

The internal wires of the driving circuit control signal output unit may extend to the two top layers and are connected to the fixation wires, selectively, by the via elements disposed between the two top layers.

The two top layers may be a metal-3 layer and a metal-4 layer.

The fixation wires may provide a source voltage or a ground voltage.

According to an exemplary embodiment of the present invention, there is provided a method of outputting a driving circuit control signal of a display driver IC including a plurality of driving circuits, which operate a display panel, and a non-volatile memory, the method including storing a mode selection value indicating a test mode or a production mode in the non-volatile memory; determining whether the mode selection value stored in the non-volatile memory indicates the test mode or the production mode; and outputting a plurality of driving circuit controls signal values received from an external device to the driving circuits so as to test the driving circuits and the display panel, if the mode selection value stored in the non-volatile memory indicates the test mode, or outputting a plurality of driving circuit control signal values internally set to a plurality of fixed values to the driving circuits, if the mode selection value indicates the production mode.

The storing of the mode selection value in the non-volatile memory may be performed after the display driver IC is assembled into a module.

According to an exemplary embodiment of the present invention, there is provided a method of outputting a driving circuit control signal of a display driver IC including a plurality of driving circuits, which operate a display panel, and a non-volatile memory, the method including outputting a plurality of driving circuit control signal values, which control the driving circuits, received from an external device; storing a mode selection value indicating a production mode; and outputting a plurality of driving circuit control signal values, which control the driving circuits, internally set to a plurality of fixed values.

According to an exemplary embodiments of the present invention, there is provided a method of manufacturing a display driver IC including a plurality of driving circuits, which operate a display panel, the method including disposing a plurality of fixation wires, which provide panel, fixed voltage levels, on top layers from among a plurality of layers formed in the display driver IC; extending a plurality of internal wires, which transfer the driving circuit control signals, which control the display driver IC, to the top layers; and selectively connecting the fixation wires and the internal wires by a plurality of via elements disposed between the top layers.

BRIEF DESCRIPTION OF THE DRAWINGS

Exemplary embodiments of the present invention will be understood in more detail from the following description taken in conjunction with the attached drawings in which.

DETAILED DESCRIPTION OF EXEMPLARY EMBODIMENTS

Figure 1:
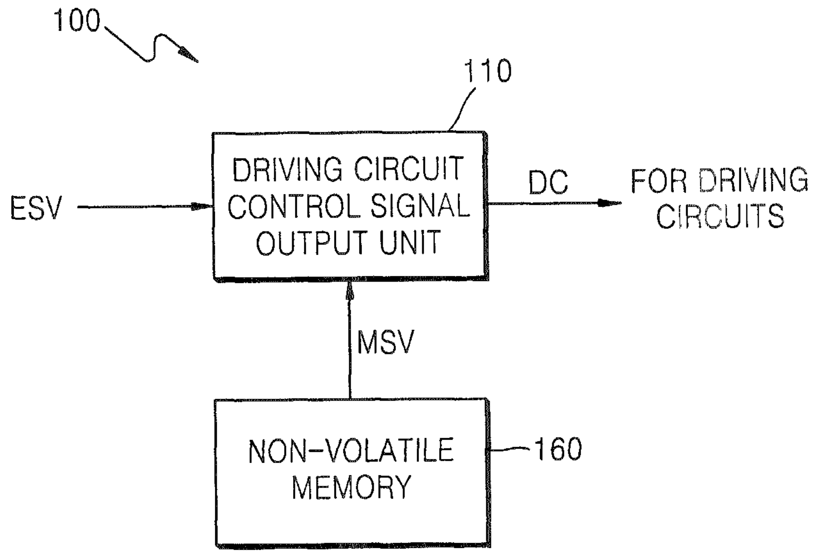
FIG. 1 is a block diagram of a display driver integrated circuit (IC), which stores an output mode of a driving circuit control signal in a non-volatile memory, according to an exemplary embodiment of the present invention.

The attached drawings for illustrating exemplary embodiments of the present invention are referred to in order to gain a sufficient understanding of the present invention, the merits thereof, and the objectives accomplished by the implementation of the present invention. Like reference numerals denote like elements in the drawings.

Hereinafter, the present invention will be described in detail by explaining exemplary embodiments of the invention with reference to the attached drawings.

FIG. 1 is a block diagram of a display driver integrated circuit (IC) 100, which stores an output mode of a driving circuit control signal in a non-volatile memory 160, according to an exemplary embodiment of the present invention.

Referring to FIG. 1, the display driver IC 100 includes a plurality of driving circuits (not shown), which operate a display panel (not shown), a driving circuit control signal output unit 110, and the no-volatile memory 160.

The driving circuit control signal output unit 110 outputs a plurality of driving circuit control signal values DC to the driving circuits (not shown). The driving circuit control signal output unit 110 receives a plurality of external setting values ESV form an external device and outputs the driving circuit control signal values DC in a test mode. Also, the driving circuit control signal output unit 110 outputs the driving circuit control signal values DC as a plurality of fixed values in a production mode. The non-volatile memory 160 stores a mode selection value MSV indicating the test mode or the production mode. The driving circuit control signal output unit 110 operates in the test mode or the production mode in response to the mode selection value MSV received from the non-volatile memory 160.

According to the exemplary embodiment of the present invention, the mode selection value MSV can be stored in the non-volatile memory 160 after a display driver IC module (hereinafter, referred to as an IC module) and the display panel are assembled into a display module (not shown), or after the display driver IC 100 is assembled into the IC module (not shown). Otherwise, the mode selection value MSV can be stored in the non-volatile memory 160 before the IC module or the display module is assembled.

Conventionally, whether to fix driving circuit control signal values or not is determined by a signal input through an input/output pin of a display driver IC (not shown). Accordingly, if the assembling of the display driver IC into an IC module is completed, whether to fix the driving circuit control signal values or not cannot be changed.

According to an exemplary embodiment of the present invention, however, the mode selection value MSV, which determines whether to fix the driving circuit control signal values DC or not, is stored in the non-volatile memory 160. Accordingly, whether to fix the driving circuit control signal values DC or not can be changed based on the mode selection value MSV stored in the non-volatile memory 160 regardless of whether the display driver IC 100 is assembled into the display module or the IC module.

The non-volatile memory 160 may store only the mode selection value MSV indicating the production mode. That is, if the mode selection value MSV is stored in the non-volatile memory 160, the display driver IC 100 may operate in the production mode. If the mode selection value MSV is not stored in the non-volatile memory 160, the display driver IC 100 may operate in the test mode.

The non-volatile memory 160 may be assembled in the same module with the display driver IC 100 and the driving circuits, or it may be assembled in a separate module from the display driver IC 100 and the driving circuits.

The storing of the mode selection value MSV in the non-volatile memory 160 is performed after the display driver IC is assembled into a module. Furthermore, the storing of the mode selection value MSV in the non-volatile memory 160 is performed just before the module is provided to the market.

The non-volatile memory 160 may be a one-time programmable device (OTP), a multi-time programmable device (MTP), or a flash memory.

Figure 2:
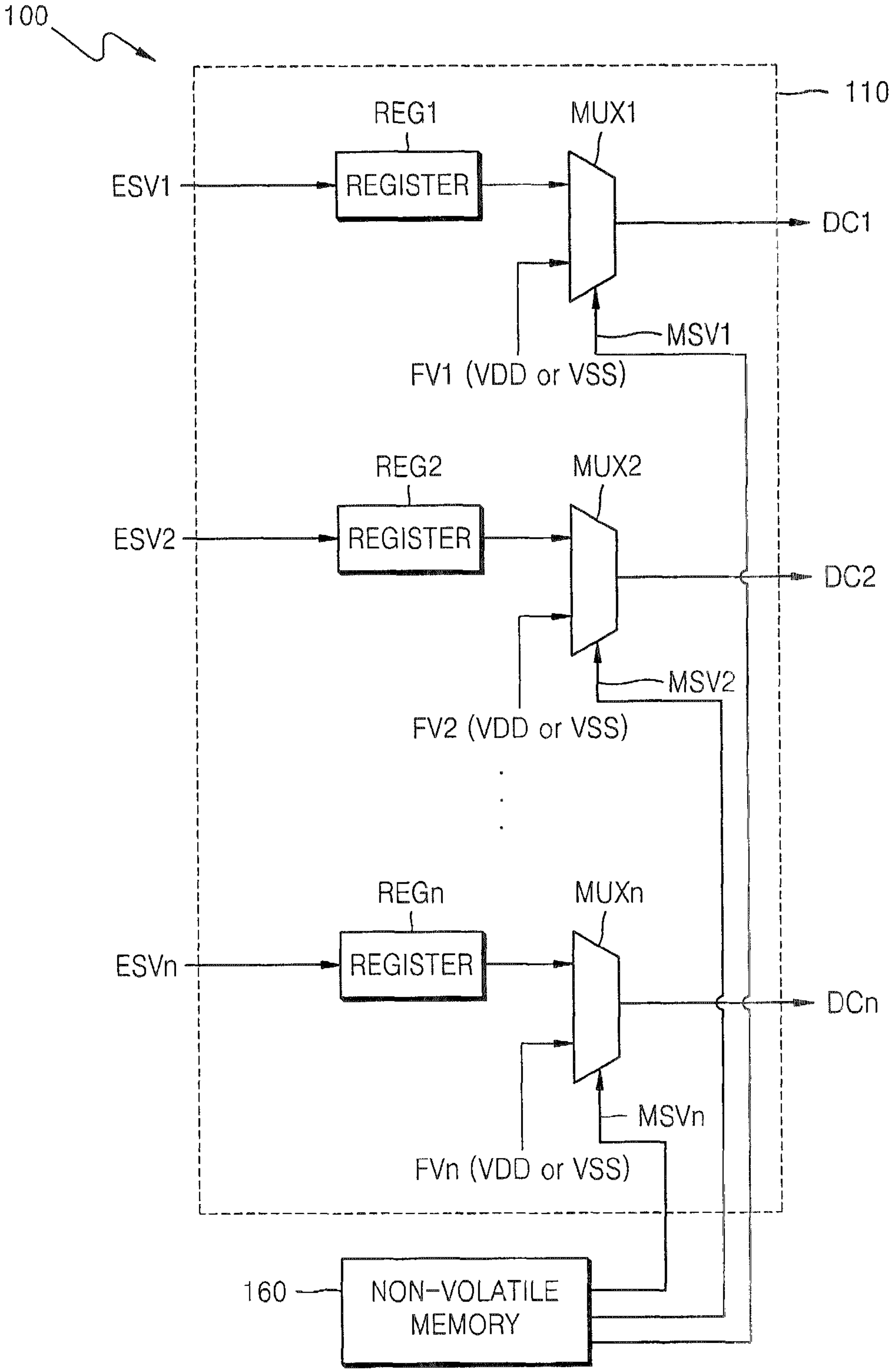
FIG. 2 is a detailed block diagram of the display driver IC of FIG. 1, according to an exemplary embodiment of the present invention.

FIG. 2 is a detailed block diagram of the display driver IC 100 of FIG. 1, according to an embodiment of the present invention.

Referring to FIG. 2, the driving circuit control signal output unit 110 of the display driver IC 100 may include a plurality of registers REG1 through REGn. In the test mode, the registers REG1 through REGn receive a plurality of external setting values EVS1 through EVSn, respectively, from an external device (not shown). The plurality of registers REG through REGn store the external setting values ESV1 through ESVn, respectively. Then, the plurality of registers REG1 through REGn output the stored external setting values ESV1 through ESVn as a plurality of driving circuit control signal values DC1 through DCn, respectively.

The driving circuit control signal output unit 110 may further include a plurality of multiplexers MUX1 through MUXn respectively corresponding to the plurality of registers REG1 through REGn. The plurality of multiplexers MUX1 through MUXn selectively output the driving circuit control signal values DC1 through DCn output from the corresponding registers REG1 through REGn or output the driving circuit control signal values DC1 through DCn set to a plurality of fixed values FV1 through FVn in accordance with a plurality of received made selection values MSV1 through MSVn stored in the non-volatile memory 160, respectively.

For example, if the mode selection values MSV1 through MSVn are 1, the plurality of multiplexers MUX1 through MUXn may output the fixed values FV1 through FVn as the driving circuit control signal values DC1 through DCn, respectively, and if the mode selection values MSV1 through MSVn are 0, the plurality of multiplexers MUX1 through MUXn may output the external setting values ESV1 through ESVn as the driving circuit control signal values DC1 through DCn, respectively.

The fixed values FV1 through FVn may be the value of a source voltage VDD or a ground voltage VSS. For example, if the fixed value FV1 is the value of source voltage VDD, the driving circuit control signal value DC1 output from the multiplexer MUX1 can be fixed to 1. Also, if the fixed value FV2 is the value of the ground voltage VSS, the driving circuit control signal value DC2 output from the multiplexer MUX2 can be fixed to 0.

The driving circuit control signal values DC1 through DCn output as described above are input to a plurality of driving circuits (not shown) and are used to control the driving circuits.

Figure 3A:
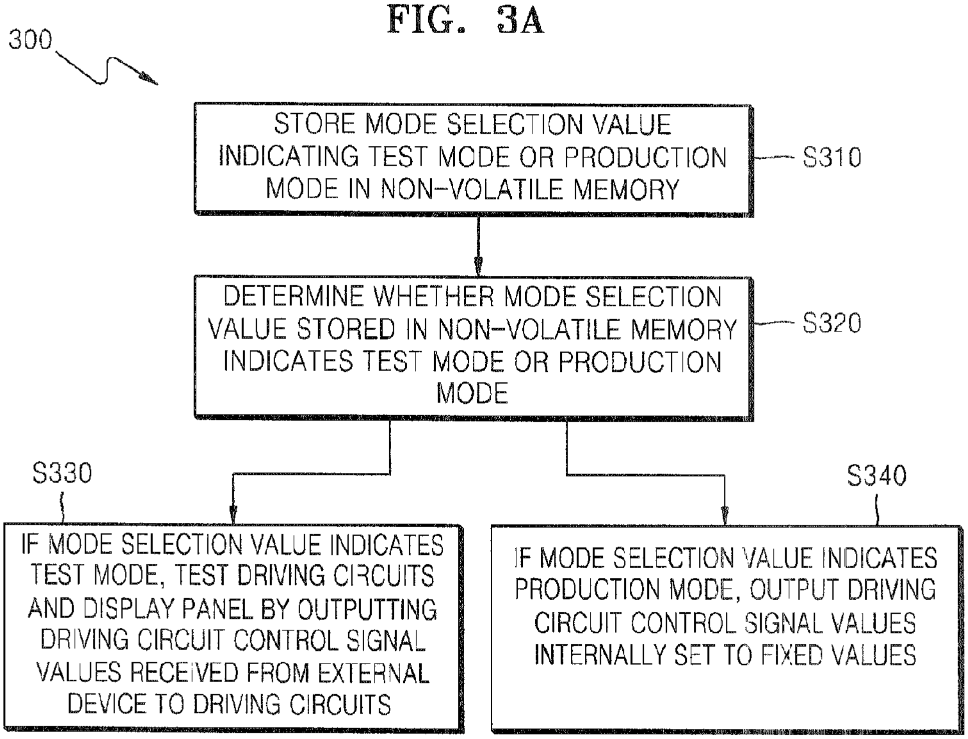
FIG. 3A is a flowchart of a method of outputting a driving circuit control signal according to an exemplary embodiment of the present invention.

FIG. 3A is a flowchart of a method 300 of outputting a driving circuit control signal according to an exemplary embodiment of the present invention.

Referring to FIG. 3A, the method 300 according to the exemplary embodiment of the present invention is a method of outputting the driving circuit control signal a display driver IC including a plurality of driving circuits, which operate a display panel.

The method 300 of outputting the driving circuit control signal includes storing a mode selection value indicating a test mode or a production mode in a non-volatile memory (operation S310); determining whether the mode selection value stored in the non-volatile memory indicates the test mode or the production mode (operation S320); and outputting a plurality of driving circuit control signal values to the driving circuits (operations S330 and S340).

If the mode selection value stored in the non-volatile memory indicates the test mode, a plurality of driving circuit control signal values are received from an external device and are output to the driving circuits (operation S330). As such, the driving circuits and the display panel are tested using the driving circuit control signal values received from the external device. If the mode selection value indicates the production mode, a plurality of driving circuit control signal values are internally set to a plurality of fixed values and are output to the driving circuits (operation S330). As such, the driving circuit control signal values are not allowed to be changed by the external device.

The storing of the mode selection value (operation S310) may be performed to store only the mode selection value indicating the production mode. If the mode selection value is stored in the non-volatile memory, the outputting of the driving circuit control signal values (operations S330 and S340) may be performed in the production mode, and the output driving circuit control signal values are set to the fixed values. If the mode selection value is not stored in the non-volatile memory, the outputting of the driving circuit control signal values (operations S330 and S340) may be performed in the test mode, and the output driving circuit control signal values are received from the external device.

The storing of the mode selection value (operation S310) in the non-volatile memory is performed after the display driver IC is assembled into a module. Furthermore, the storing of the mode selection value in the non-volatile memory (operation S310) is performed just before the module is provided to the market.

If the mode selection value indicates the production mode, the output driving circuit control signal values may be fixed to a value of a source voltage or a ground voltage.

Figure 3B:
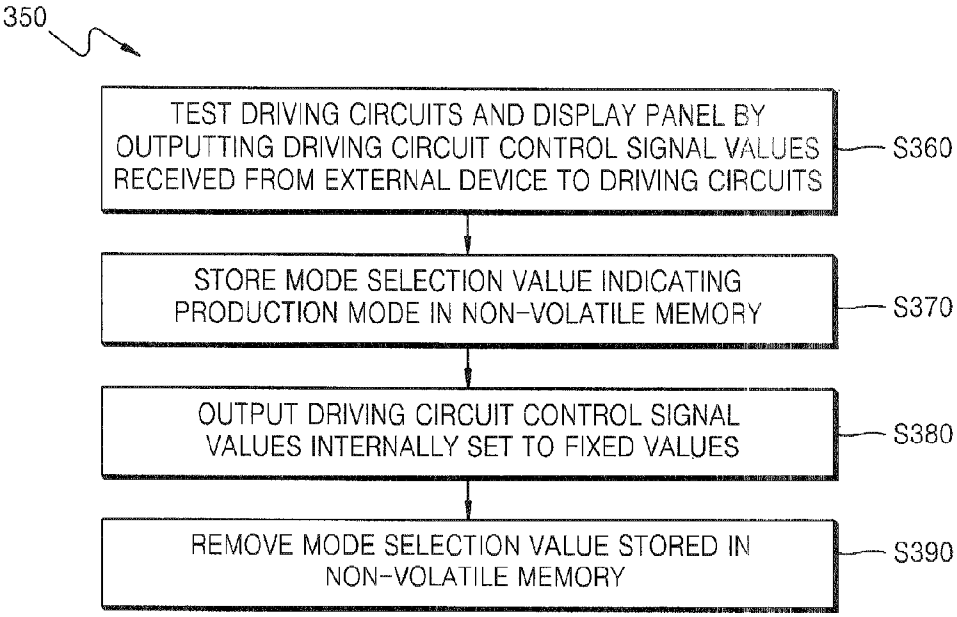
FIG. 3B is a flowchart of a method of outputting a driving circuit control signal according to an exemplary embodiment of the present invention.

FIG. 3B is a flowchart of a method 350 of outputting a driving circuit control signal according to an exemplary embodiment of the present invention.

Referring to FIG. 3B, the method 350 according to an exemplary embodiment of the present invention includes receiving a plurality of driving circuit control signal values that control a plurality of driving circuits from an external device and outputting the driving circuit control signal values (operation S360); storing a mode selection value indicating a production mode in a non-volatile memory (operation S370); and outputting the driving circuit control signal values set to a plurality of fixed values (operation S380).

The method 350 may further include removing the mode selection value stores in the non-volatile memory (operation S390) after the outputting of the driving circuit control signal values is set to the fixed values (operation S380).

The method 350 may return to the receiving of the driving circuit control signal values from the external device and outputting the driving circuit control signal values (operation S360) after the removing of the mode selection value (operation S390) from the non-volatile memory.

Figure 4A:
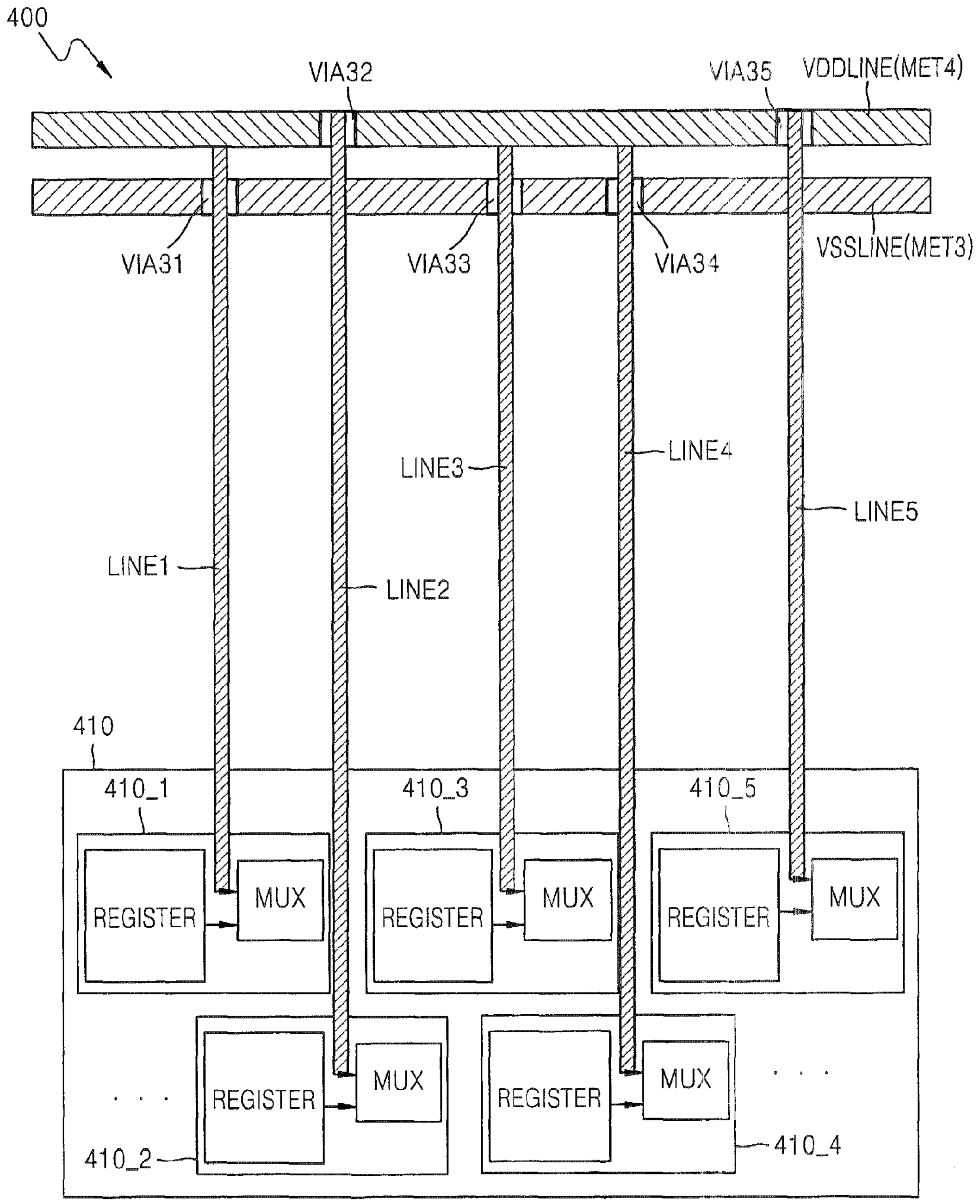
FIG. 4A is a block diagram of a display driver IC, which fixes the driving circuit control signal values using fixation wires disposed on top layers of the display driver IC, according to an exemplary embodiment of the present invention.

FIG. 4A is a schematic representation of a display driver IC 400 that fixes the driving circuit control signal values using fixation wires VDDLINE and VSSLINE respectively disposed on top layers MET3 and MET4 of the display driver IC 400, according to an exemplary embodiment of the present invention.

Referring to FIG. 4A, the display driver IC 400 includes a plurality of driving circuits (not shown), which operate a display panel, a driving circuit control signal output unit 410 and the fixation wires VDDLINE and VSSLINE for fixing the driving circuit control signal value.

The driving circuit control signal output unit 410 outputs a plurality of driving circuit control signal values, which control the driving circuits, received from an external device, or outputs a plurality of driving circuit control signal values, which control the driving circuits, internally set to a plurality of fixed values. The fixation wire VDDLINE and VSSLINE provide the driving circuit control signal values set to the fixed values to the driving circuit control signal output unit 410.

The fixation wires VDDLINE and VSSLINE are disposed on top layers MET3 and MET4 from among a plurality of layers. A plurality of internal wires LINE1 through LINE5 of the driving circuit control signal output unit 410 may extend to the top layers MET3 and MET4. The extended internal wires LINE1 through LINE5 are connected to the fixation wire VDDLINE or the fixation wire VSSLINE, selectively.

Figure 4B:
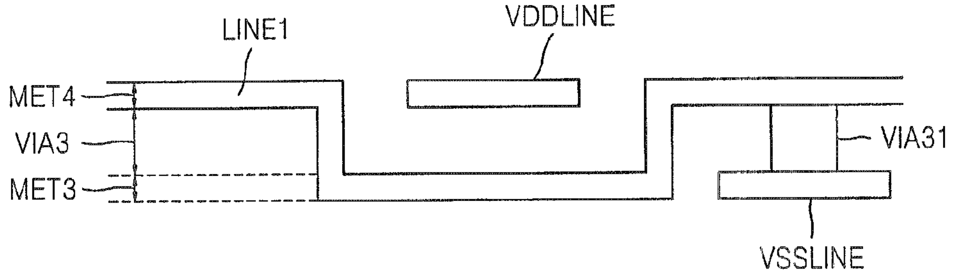
FIGS. 4B and 4C are side views of portions of the display driver IC of FIG. 4A, according to exemplary embodiments of the present invention.
Figure 4C:
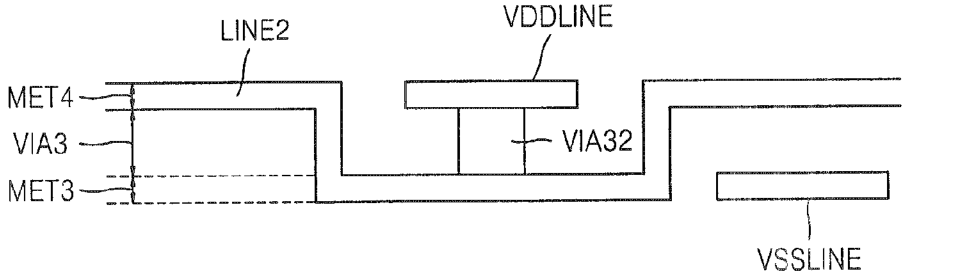

The internal wires LINE1 through LINE5 of the driving circuit control signal output unit 410 can be connected to the fixation wire VDDLINE or the fixation wire VSSLINE, selectively, by a plurality of via elements VIA31 through VIA35. The via elements VIA31 through VIA35 may be disposed between the top layers MET3 and MET4, as shown in FIGS. 4B and 4C.

The top layers MET3 and MET4 may be two top layers MET3 and MET4 from among the layers MET1 through MET4 formed in the display driver IC 400, although only layers MET3 and MET4 are shown in FIG. 4A. For example, the top layers MET3 and MET4 may be a metal-3 layer MET3 and a metal-4 layer MET4. The via elements VIA31 through VIA35 may disposed in a via-3 layer VIA3 disposed between the metal-3 layer MET3 and the metal-4 layer MET4.

The driving circuit control signal output unit 410 may include a plurality of sub control signal output units 410_1 through 410_5. Each of the sub control signal output units 410_1 through 410_5 may include a register and a multiplexer. The registers receive respective external setting values (not shown) form an external device and store the external setting values so as to output the external setting values as the driving circuit control signal values. The multiplexers output the driving circuit control signal values output from the registers or output the fixed driving circuit control signal values provided by the fixation wires VDDLINE and VSSLINE to the driving circuits, selectively.

The fixation wires VDDLINE and VSSLINE may provide a source voltage or a ground voltage.

FIGS. 4B and 4C are side views of portions of the display driver IC of FIG. 4A, according to exemplary embodiments of the present invention.

Referring to FIG. 4B, the first internal wire LINE1 of the first sub control signal output unit 410_1 extends through the metal-3 layer MET3 and the metal-4 layer MET4. The fixation wire VDDLINE, providing a source voltage VDD, may be disposed on the metal-4 layer MET4 and the fixation wire VSSLINE, providing a ground voltage VSS, may be disposed on the metal-3 layer MET3. The first internal wire LINE1 is connected to the fixation wire VSSLINE through the via element VIA31 disposed in the via-3 layer VIA3. Accordingly, a fixed ground voltage is provided to a multiplexer of the first sub control signal output unit 410_1 and the first sub control signal output unit 410_1 may output a driving circuit control signal value of the fixed ground voltage.

Referring to FIG. 4C, the second internal wire LINE2 of the second sub control signal output unit 410_2 extends through the metal-3 layer MET3 and the metal-4 layer MET4. The fixation wire VDDLINE, providing a source voltage VDD, may be disposed on the metal-4 layer MET4 and the fixation wire VSSLINE, providing a ground voltage VDD, may be disposed on the metal-3 layer MET3. The second internal wire LINE2 is connected to the fixation wire VDDLINE through the via element VIA32 disposed in the via-3 layer VIA3. Accordingly, a fixed source voltage is provided to a multiplexer of the second sub control signal output unit 410_2 and the second sub control signal output unit 410_2 may output a driving circuit control signal value of the fixed source voltage. The fixation wire VDDLINE may be disposed on the metal-3 layer MET3 and the fixation wire VSSLINE may be disposed on the metal-4 layer MET4.

Figure 5:
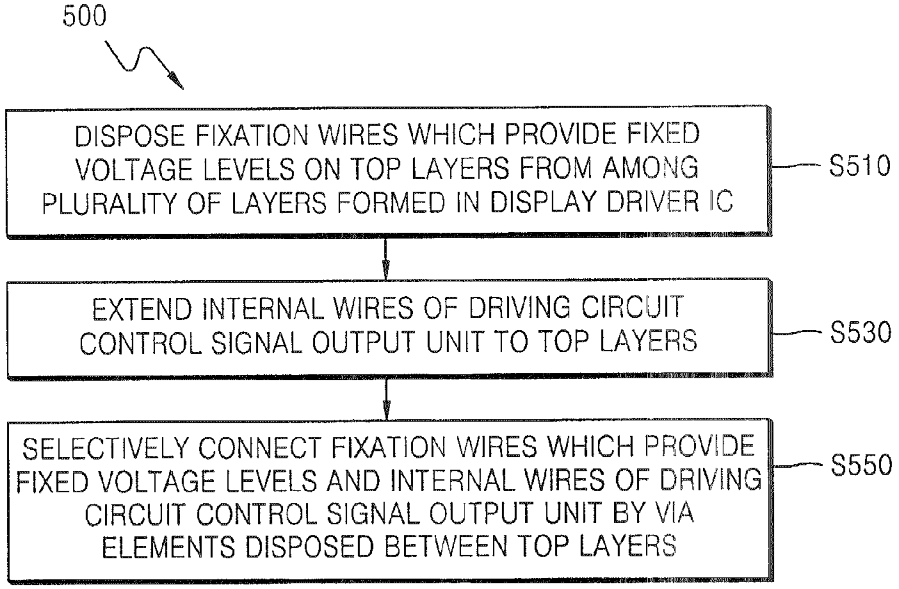
FIG. 5 is a flowchart of a method of manufacturing a display driver IC, which fixes the driving circuit control signal values using fixation wires disposed on top layers of the display driver IC, according to an exemplary embodiment of the present invention.

FIG. 5 is a flowchart of a method 500 of manufacturing a display driver IC, which includes a plurality fixation wires disposed on top layers of the display driver IC, according to an exemplary embodiment of the present invention.

Referring to FIG. 5, the method 500 includes disposing the fixation wires, which provide fixed voltage levels on top layers of a plurality of layers formed in the display driver IC (operation S510); extending a plurality of internal wires, which transfer the driving circuit control signals, which control the display driver IC, to the top layers (operation S530); and selectively connecting the fixation wires and the internal wires by a plurality of via elements disposed between the top layers (operation S550).

The technical idea of the method 500 according to the exemplary embodiment of the present invention is the same as in the display driver IC 400, according to the above-described exemplary embodiment of the present invention. The configuration of the method 500 corresponds to the configuration of the display driver IC 400. Accordingly, one of ordinary skill in the art may understand the method 500 of manufacturing the display driver IC according to the exemplary embodiment of the present invention and, thus, a detailed description thereof will be omitted.

As described above, in a display driver IC, which stores an output mode of a driving circuit control signal in a non-volatile memory, and a method of outputting the driving circuit control signal, according to exemplary embodiments of the present invention, whether to fix a driving circuit control signal value or not can be changed after the display driver IC is assembled into a module.

Furthermore, in a display driver IC that fixes the driving circuit control signal values using fixation wires disposed on top layers of the display driver IC and a method of manufacturing the display driver IC, according to exemplary embodiments of the present invention, all of the plurality of layers formed in the display driver IC need not be changed in order to modify a plurality of fixed control signal values.

While the present invention has been particularly shown and described with reference to exemplary embodiments thereof, it will be understood by one skilled in the art that various changes in form and details may be made therein without departing from the spirit and scope of the invention as defined by the appended claims. The exemplary embodiments should be considered in ad descriptive sense only and not for purposes of limitation. Therefore, the scope of the invention is defined not by the detailed description of the invention but by the appended claims, and all differences within the scope will be construed as being included in the present invention.

What is claimed is:

1. A display driver integrated circuit (IC) for a plurality of driving circuits that operate a display panel, the display driver IC comprising:

a non-volatile memory that stores a mode selection value that distinguishes whether the display driver IC is either in one of a test mode or a production mode; and a driving circuit control signal output unit that outputs one of first control signal values received from an external device and second control signal values set to a plurality of fixed values in response to whether the mode selection value stored in the non-volatile memory specifies test mode or production mode, wherein the driving circuit control signal output unit outputs the first control signal values in the test mode and the second control signal values in the production mode, and wherein the driving circuit control signal output unit operates in one of the test mode and the production mode in accordance with the mode selection value stored in the non-volatile memory regardless of whether the display drive IC is assembled into a module with the display panel.

2. The display driver IC of claim 1, wherein the driving circuit control signal output unit comprises a plurality of registers that respectively receive a plurality of external setting values from the external device, store the external setting values, and output the stored external setting values as the first control signal values.

3. The display driver IC of claim 2, wherein the driving circuit control signal output unit further comprises a plurality of multiplexers that selectively output the respective first control signal values output from the plurality of registers or output the second control signal values set to the fixed values in accordance with the mode selection value received from the non-volatile memory.

4. The display driver IC of claim 1, wherein the mode selection value is stored in the non-volatile memory after the display driver IC is assembled into the module.

5. The display driver IC of claim 4, wherein the mode selection value is stored in the non-volatile memory before the module is placed on sale.

6. The display driver IC of claim 1, wherein the non-volatile memory stores only the mode selection value indicating the production mode.

7. The display driver IC of claim 1, wherein the fixed values are a value of a source voltage or a ground voltage.

8. The display driver IC of claim 1, wherein the non-volatile memory is one of one-time programmable device (OTP), a multi-time programmable device (MTP), and a flash memory.

9. A display driver integrated circuit (IC) for a plurality of driving circuits that operate a display panel, the display driver IC comprising:

a non-volatile memory that stores a mode selection value that distinguishes the display driver IC being either in a production mode or in a test mode;

a driving circuit control signal output unit that outputs second control signal values set to a plurality of fixed values in response to the mode selection value stored in the non-volatile memory that specifies the display driver IC being in the production mode, wherein the driving circuit signal output unit operates in either the production mode if the mode selection value is received from the non-volatile memory or operates in a test mode if the mode selection value is not received from the non-volatile memory, wherein the driving circuit control signal output unit operates in one of the test mode and the production mode in accordance with the mode selection value stored in the non-volatile memory regardless of whether the display drive IC is assembled into a module with the display panel, wherein the driving circuit control signal output unit outputs first control signal values received from an external device in the test mode and the second control signal values in a production mode.

10. The display driver IC of claim 9, wherein the driving circuit control signal output unit comprises a plurality of registers that receive a respective plurality of external setting values from the external device, store the external setting values, and output the stored external setting values as the plurality of first control signal values.

11. The display driver IC of claim 10, wherein the driving circuit control signal output unit further comprises a plurality of multiplexers that output the respective first control signal values output from the plurality of registers if the mode selection value is not received from the non-volatile memory, and outputs the second control signal values set to the fixed values if the mode selection value is received from the non-volatile memory.

12. The display driver IC of claim 9, wherein the mode selection value indicating the production mode is stored in the non-volatile memory after the display driver IC is assembled into the module.

13. The display driver IC of claim 9, wherein the fixed values are a value of a source voltage or a ground voltage.

14. The display driver IC of claim 9, wherein the non-volatile memory is one of a one-time programmable device (OTP), a multi-time programmable device (MTP), and a flash memory.

15. A display driver integrated circuit (IC) for a plurality of driving circuits that operate a display panel, the display driver IC comprising:

a driving circuit control signal output unit that outputs one of first control signal values received from an external device and second control signal values set to a plurality of fixed values in response to a mode selection value in a non-volatile memory that distinguishes whether the display driver IC is in a test mode or in a production mode, wherein the driving circuit control signal output unit outputs the first control signal values in a test mode and the second control signal values in a production mode, wherein the driving circuit control signal output unit operates in one of the test mode and the production mode in response to the mode selection value in the non-volatile memory regardless of whether the display drive IC is assembled into a module with the display panel, and a plurality of fixation wires that provide the second control signal values set to a plurality of fixed values to the driving circuit control signal output unit, wherein the fixation wires are disposed on top layers from among a plurality of layers formed in the display driver IC.

16. The display driver IC of claim 15, wherein a plurality of internal wires of the driving circuit control signal output unit extend to the top layers and are selectively connected to the fixation wires.

17. The display driver IC of claim 16, wherein the internal wires of the driving circuit control signal output unit are selectively connected to the fixation wires by a plurality of via elements.

18. The display driver IC of claim 15, wherein the top layers are two top layers from among the plurality of layers formed in the display driver IC.

19. The display driver IC of claim 17, wherein the internal wires of the driving circuit control signal output unit extend to the two top layers and are selectively connected to the fixation wires by the plurality of via elements disposed between the two top layers.

20. The display driver IC of claim 18, wherein the two top layers are a metal-3 layer and a metal-4 layer.

21. The display driver IC of claim 15, wherein the fixation wires provide a source voltage or a ground voltage.

22. The display driver IC of claim 15, wherein the driving circuit control signal output unit comprises:

a plurality of registers that respectively receive a plurality of external setting values from the external device and store the external setting values so as to output the external setting values as the control signal values; and a plurality of multiplexers that respectively output the first control signal values outputted from the plurality of registers or output the second control signal values set to the fixed values, selectively, wherein the fixation wires provide the second control signal values set to the fixed values to the plurality of multiplexers.

23. A method of outputting a driving circuit control signal of a display driver integrated circuit (IC) including a plurality of driving circuits that operate a display, the method comprising:

storing in a non-volatile memory a mode selection value that distinguishes whether the display driver IC is either in a test mode or in a production mode;

determining whether the mode selection value stored in the non-volatile memory distinguishes whether in the test mode or the production mode; and outputting a plurality of first control signal values received from an external device to the driving circuits so as to test the driving circuits and the display panel, if the mode selection value received from the non-volatile memory specifies the test mode, or outputting a plurality of second control signal values set to a plurality of fixed values to the driving circuits, if the mode selection value received from the non-volatile memory specifies the production mode, wherein the steps of outputting the first control signal values and the second control signal values are operating in response to the mode selection value in the non-volatile memory regardless of whether the display drive IC is assembled into a module with the display panel.

24. The method of claim 23, wherein the step of storing of the mode selection value is performed to store only the mode selection value indicating the production mode.

25. The method of claim 24, wherein the step of outputting the plurality of first control signal values is operating in the test mode if the mode selection value is not received from the non-volatile memory, and wherein the step of outputting the plurality of second control signal values is operating in the production mode if the mode selection value is received from the non-volatile memory.

26. The method of claim 23, wherein the step of storing the mode selection value in the non-volatile memory is performed after the display driver IC is assembled into the module.

27. The method of claim 23, wherein the step of outputting the plurality of second control signal values is performed by setting the driving circuit control signal values to a value of a source voltage or a ground voltage, if the mode selection value indicates the production mode.

28. A method of outputting a driving circuit control signal of a display driver integrated circuit (IC) including a non-volatile memory and a plurality of driving circuits that operate a display panel, the method comprising:

outputting a plurality of first control signal values that control the driving circuits, wherein the first control signal values are received from an external device;

storing a mode selection value in the non-volatile memory, the mode selection value distinguishing whether the display driver IC is in a production mode or in a test mode; and outputting a plurality of second control signal values that control the driving circuits, wherein the second control signal values are set to a plurality of fixed values when in the production mode in accordance with the mode selection value in the non-volatile memory, wherein the steps of outputting the first control signal values and the second control signal values are operating regardless of whether the display drive IC is assembled into a module with the display panel.

29. The method of claim 28, further comprising removing the mode selection value stored in the non-volatile memory after the outputting of the second control signal values set to the fixed values; and performing the receiving of the first control signal values from the external device and outputting the first control signal values after the removing of the mode selection value from the non-volatile memory.

30. The method of claim 28, wherein the non-volatile memory is one of a one-time programmable device (OTP), a multi-time programmable device (MTP), and a flash memory.

31. A method of manufacturing a display driver integrated circuit (IC) including a plurality of driving circuits that operate a display panel, the method comprising:

disposing a plurality of fixation wires that provide fixed voltage levels on top layers from among a plurality of layers forming the display driver IC;

extending to the top layers a plurality of internal wires that transfer a plurality of first control signals received from an external device and a plurality of second control signals set to the fixed voltage levels, the first control signals and the second control signals configured to-control the plurality of driving circuits; and selectively connecting the fixation wires and the internal wires by a plurality of via elements disposed between the top layers, wherein in response to a mode selection value stored in a non-volatile memory that distinguishes the display driver IC being in a test mode, the first control signals configured to operate the display panel, and in response to the mode selection value stored in the non-volatile memory that distinguishes the display driver IC being in a production mode, the second control signals configured to operate the display panel, and wherein the steps of outputting the first control signal values and the second control signal values regardless of whether the display drive IC is assembled into a module with the display panel.

32. The method of claim 31, wherein the top layers are two top layers from among the plurality of layers forming the display driver IC.

33. The method of claim 32, wherein the step of selectively connecting the fixation wires and the internal wires is performed by selectively connecting the fixation wires and the internal wires by the via elements disposed between the two top layers.

34. The method of claim 32, wherein the two top layers are a metal-3 layer and a metal-4 layer.

35. The method of claim 31, wherein the fixation wires provide a source voltage or a ground voltage.

* * * * *